United States Patent [19]

de Vries

[11] 4,336,512

[45] Jun. 22, 1982

[54] PULSE WIDTH GENERATOR HAVING A VARIABLE MARK-TO-SPACE RATIO

[75] Inventor: Jacob de Vries, Allenwinden, Switzerland

[73] Assignee: LGZ Landis & Gyr Zug AG, Zug, Switzerland

[21] Appl. No.: 91,114

[22] Filed: Nov. 5, 1979

[30] Foreign Application Priority Data

Nov. 13, 1978 [CH] Switzerland .................. 11635/78

[51] Int. Cl.³ .............................................. H03K 7/08
[52] U.S. Cl. ..................................... 332/9 R; 307/265; 328/58; 375/22
[58] Field of Search .................. 332/9 R, 9 T, 14; 307/265; 328/111, 112, 58; 375/22; 330/107

[56] References Cited

U.S. PATENT DOCUMENTS

| 3,074,057 | 1/1963 | Gilbert | 328/58 |
| 3,441,877 | 4/1969 | Thompson | 332/9 R |
| 3,535,657 | 10/1970 | Webb | 332/9 R |
| 3,571,626 | 3/1971 | Reif | 307/265 X |
| 3,866,146 | 2/1975 | Van Mourik | 332/9 R |

Primary Examiner—Siegfried H. Grimm
Assistant Examiner—Edward P. Westin
Attorney, Agent, or Firm—Ernest F. Marmorek

[57] ABSTRACT

A variable pulse width generator generates a periodically recurring and variable mark-to-space ratio waveform, so that the ratio of the difference between the space and mark durations to the sum of the space and mark durations is proportional to a selectable voltage, and substantially independent of any resistor values used in the circuit.

9 Claims, 6 Drawing Figures

PULSE WIDTH GENERATOR HAVING A VARIABLE MARK-TO-SPACE RATIO

BACKGROUND OF THE INVENTION

A pulse width generator is known from U.S. Pat. No. 3,441,877, issued to Thompson, in which a measurement current $I_m$ passing through a resistor $R_1$ obtained from a voltage source $U_m$ passes into a Miller-generator, which consists of an amplifier V, and a capacitor C connected across the input and the output of the amplifier V. A Schmitt-type trigger ST is postcoupled to the output of the amplifier V, which in turn controls a switch S of a reference voltage source Q. In one position of the switch S the input of the amplifier V is connected via a resistor R to a positive reference voltage $+U_r$, and in another position of the switch S the input of the amplifier V is connected via the resistor R to a negative reference voltage $-U_r$. Consequently, a reference current $I_r$, which is superimposed upon the current $I_m$, and is either positive or negative in dependence of the position of the switch S, passes to the input E of the Miller-type integrator M.

Across the output of the Miller-type integrator M there appears a triangular voltage $U_i$, which according to FIG. 2, ascends or is positive-going, until it reaches an upper threshold value $U_{s1}$ of the Schmitt-type trigger ST, the Schmitt-type trigger ST subsequently flipping over so as to reverse the switch S, the reference current $I_r$ changing its polarity, and the voltage $U_i$ descending, or becoming negative-going, until it reaches a lower threshold value $U_{s2}$ of the Schmitt-type trigger circuit ST. At the output of the Schmitt-type trigger circuit ST, there appears a waveform of rectangular pulses, having a mark duraction $T_a$, and a space duration $T_b$.

The rectangular voltage waveform is governed by the equation:

$$\frac{T_a - T_b}{T_a + T_b} = -\frac{I_m}{I_r} = -\frac{U_m}{U_r} \cdot \frac{R}{R_1}$$

The ratio $(R)/(R_1)$ represents a constant of proportionality, so that R and $R_1$ must be precision resistances.

The above U.S. Pat. No. 3,441,877 is incorporated into the present application by reference.

A pulse-time encoding apparatus is also known from U.S. Pat. No. 3,074,057 issued to Gilbert.

There is also known an integrating quasi-sweeping voltage-to-time-interval converter from volume 19, number 2, part 1 of the Russian Journal "Instruments and Experimental Techniques", March-April, 1976. The integrating quasi-sweeping voltage-to-time-interval converter described in that publication is a variable pulse width generator, including a differential amplifier with two inputs, the input voltage of the integrating quasi-sweeping voltage-to-time-interval converter being connected to one input of the differential amplifier, the other input of the differential amplifier being connected via a capacitor and via a resistor to a reference voltage source. Although the mark-to-space ratio of the integrating quasi-sweeping voltage-to-time interval converter is independent of the value of that resistor, the operation of the integrating quasi-sweeping voltage-to-time-interval converter is subject to disturbances if the input voltage is rapidly changed. The integrating quasi-sweeping voltage-to-time-interval converter is therefore only suitable for applications, where the input voltage changes only relatively slowly.

SUMMARY OF THE INVENTION

It is therefore an object of the present invention to devise a variable pulse width generator, which is dependent only on the ratio of a selectable voltage compared to a reference voltage, and independent of any resistor values, which is simple to operate, and which is not subject to any disturbances, when the selectable voltage is changed relatively quickly.

This object is attained, according to the present invention, by a variable pulse width generator having features claimed in the appended claims.

BRIEF DESCRIPTION OF THE DRAWING

The present invention will be better understood with the aid of implementation examples in which.

DESCRIPTION OF THE PREFERRED EMBODIMENTS

Figure 1:
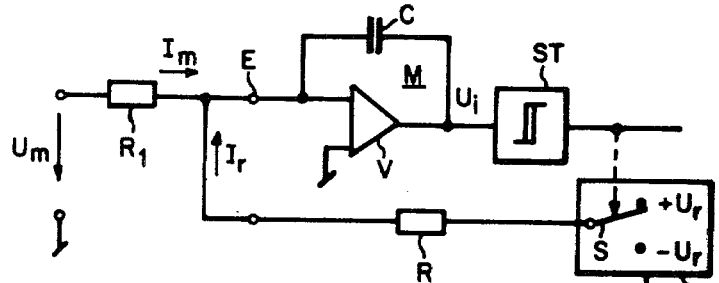
FIG. 1 shows a circuit of the prior art of a variable pulse width generator.
Figure 3:
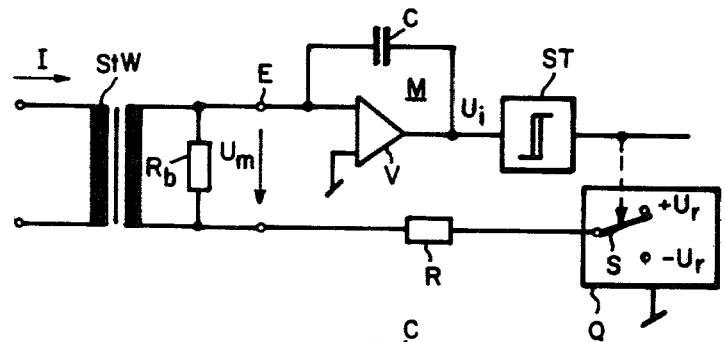
FIG. 3 is a first version of a circuit of a variable pulse width generator, according to the present invention.

Referring now to FIG. 3, the variable pulse width generator shown in FIG. 3 uses the same reference numerals as the pulse width generator of the prior art shown in FIG. 1. The variable pulse width generator, according to FIG. 3, also includes the Miller-integrator M, a Schmitt-type trigger ST, and a reference voltage source Q supplying the reference voltages $+U_r$ or $-U_r$. The circuit elements are connected to one another in a manner similar to the circuits of the prior art shown in FIG. 1, and also operate in a similar manner. There is also provided a resistance R, which is not, however, connected directly to the input of the Miller-type integrator M, but is connected in series with a load resistor $R_b$ of a current converter StW between the input E of the Miller integrator M, and the reference voltage source Q. A current I passes through the primary winding of current transformer StW, and a measurement voltage $U_m$ is obtained across the load resistor $R_b$. The load resistor $R_b$ acts as a voltage source, and the reference voltage source Q, the resistor R, and the load resistor $R_b$ are connected in series, forming a feedback path which is permanently connected between the input E of the Miller-type integrator M and the reference voltage source Q. Consequently, a current passes through this feedback path to the Miller-type integrator M, which current contains a component proportional to the measuring voltage $U_m$, and a component proportional to the reference voltage $+U_r$ or $-U_r$.

The following equations apply:

$$T_a = \frac{U_h \cdot C (R + R_b)}{U_r + U_m} \quad \text{(a)}$$

-continued $$T_b = \frac{U_h \cdot C(R + R_b)}{U_r - U_m} \quad (b)$$

It should be noted that the equations (1) through (11) of the above-noted Thompson reference (U.S. Pat. No. 3,441,877) apply if $a = 1$ $V_1 = U_m$ $V_2 = U_r$ $R_2 = R$ $t_1 = T_a$ $t_2 = T_b$ However, equation (5) of Thompson should read $$t_1 = \frac{KV_x}{\frac{V_1}{R_1} + \frac{V_2}{R_2}}$$

Figure 2:
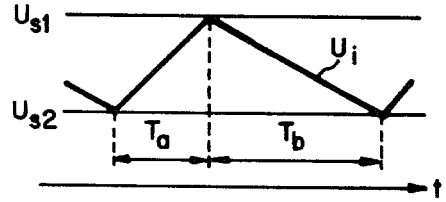
FIG. 2 shows a voltage-time diagram of the variable pulse-width generator according to FIG. 1.

From equation (11), it will be seen that the ratio of the $m = (t_1)/(t_2)$ mark-to-space duration is dependent on the ratio $c = (R_2)/(R_1)$ [equation (8)].
If the symbols used in the present application shown in FIGS. 1 and 2 are substituted into equation (11), one obtains $$m = \frac{T_a}{T_b} = \frac{U_r - \frac{R}{R_1} U_m}{U_r + \frac{R}{R_1} U_m} \quad (c)$$

Figure 4:
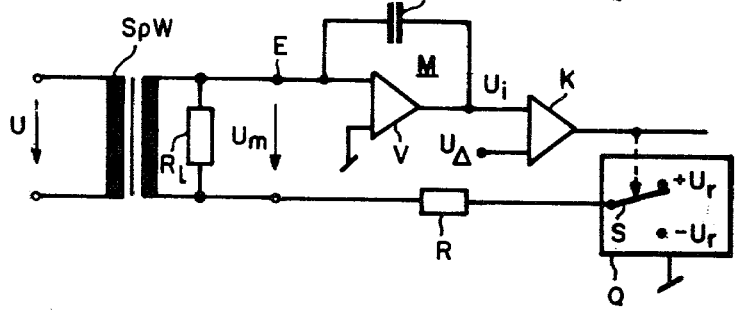
FIG. 4 is a second version of a variable pulse width generator, according to the present invention.

In the circuit according to FIGS. 3 and 4, and from equations (a) and (b), it follows that $$m = \frac{T_a}{T_b} = \frac{\frac{U_h \cdot C(R + R_b)}{U_r + U_m}}{\frac{U_h \cdot C(R + R_b)}{U_r - U_m}} = \frac{U_r - U_m}{U_r + U_m} \quad (d)$$

In Thompson, m depends on the resistance ratio $R_2/R_1$ whereas it is substantially independent of any resistance ratios in the present invention.

It follows from equation (d) that $$\frac{T_a - T_b}{T_a + T_b} = -\frac{U_m}{U_r} \quad (e)$$

wherein $U_h = U_{s1} - U_{s2}$. The ratio of the difference of the mark duration $T_a$ and the space duration $T_b$, to the sum of the mark duration $T_a$ and the space duration $T_b$ is therefore substantially dependent only upon the measurement voltage $U_m$ and the reference voltage $U_r$. The value of the resistance R does not enter into the measurement result. In lieu of the current transformed StW having a load resistor $R_b$, there can also be used a voltage transformer SpW with a load resistor $R_1$ across its secondary which supplies a voltage $U_m$ proportional to the voltage U, and which is connected in a feedback path via the resistor R to the reference voltage source Q.

Figure 5:
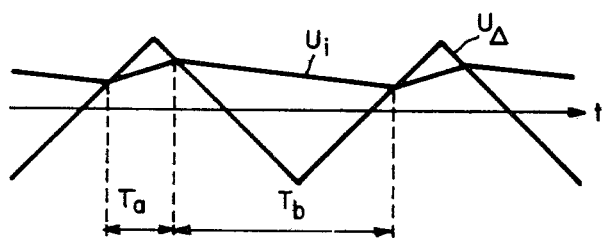
FIG. 5 is a voltage-time diagram of the circuit according to a second version of the present invention.

A comparator K is provided to supervise the voltage $U_i$ of the Miller-type integrator M, as can be seen in FIG. 4, which compares the voltage $U_i$ with a triangular voltage waveform $U_\Delta$, and as shown in FIG. 5, switches over the polarity of the reference voltage $U_r$, if the voltage $U_i$ exceeds, or falls below the instantaneous respective values of the triangular voltage waveform $U_\Delta$. The equation:

$$\frac{T_a - T_b}{T_a + T_b} = -\frac{U_m}{U_r}$$

applies, where $T_a + T_b$ corresponds to the period of the triangular voltage waveform $U_\Delta$, and is independent of the measurement voltage $U_m$.

It should be noted that the period of the alternating voltage applied across the primary of the voltage transformer SpW (or current transformer StW) should be large compared to the period of the triangular waveform.

Figure 6:
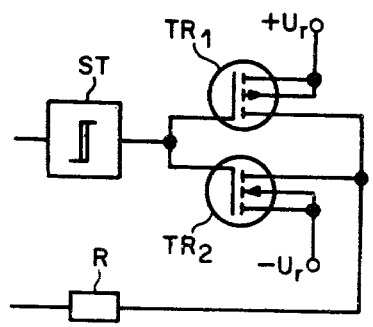
FIG. 6 shows one version of the output stage of the variable pulse width generator.

One version of an output stage of the circuit of FIG. 3 is shown, for example, in FIG. 6. The switch S of FIGS. 1, 3 and 4 is formed by two CMOS field effect transistors $TR_1$ and $TR_2$. Transistor $TR_1$ is a P-channel type, and transistor $TR_2$ an N-channel type. The output of the Schmitt-trigger ST (FIG. 3) or of the comparator K (FIG. 4) is connected to the gates of the two field effect transistors. The source of $TR_1$ and its substrate are connected to the reference voltage $+U_r$, and the source of $TR_2$ and its substrate are connected to the reference voltage $-U_r$. The drain of both transistors is connected to the resistor R. In lieu of the transistors $TR_1$ and $TR_2$, it is alternately possible to use a CMOS gate, such as type MC 14001 B, manufactured by Motorola.

I wish it to be understood that I do not desire to be limited to the exact details of construction shown and described, for obvious modifications will occur to a person skilled in the art.

Having thus described the invention, what I claim as new and desire to be secured by Letters Patent, is as follows:

1. A variable pulse width generator for generating a waveform having a periodically recurring and variable mark-to-space ratio, wherein the ratio of the difference between the space and mark durations to the sum of the space and mark durations is proportional to a selectable voltage,
   comprising in combination:
   integrator means, at least a portion of the selectable voltage being applied to the input of said integrator means,
   switching means postcoupled to said integrator means for receiving a reference voltage of selectable polarity, the polarity of the reference voltage being selectable in dependence of the integrating action of said integrator means, and
   a feedback path permanently connecting the output of said switching means to the input of said integrating means, and including a first resistor connected to said switching means and a second resistor in series therewith connected to said integrator means, said selectable voltage being applied across a selected one of said resistors, the junction of said resistors being free from any direct connection to either of said means, at least a portion of a voltage developed across the output of said switching means being thereby applied across the input of said integrator means, said switching means thereby operating in dependence of at least a portion of the voltage sum of said selectable and reference voltages appearing at the input of, and being integrated at the output of said integrator means, and the ratio of the difference between the space and mark durations to the sum of the space and mark durations being thereby substantially independent of the other of said first and second resistors.

2. A variable pulse width generator as claimed in claim 1, wherein said switching means includes comparator means for comparing the output of said integrating means with a periodically recurring triangular waveform having a period identical to the period of the waveform having a variable mark-to-space ratio, and a switch controlled by said comparator means.

3. A variable pulse width generator as claimed in claim 1, wherein said switching means includes a Schmitt-trigger circuit.

4. A variable pulse width generator as claimed in claim 1, wherein said integrating means includes an amplifier and a capacitor connected between the input and output of said amplifier.

5. A variable pulse width generator as claimed in claim 1, wherein the ratio of the difference between the space and mark durations to the sum of the space and mark durations is substantially equal to the value of the ratio of said selectable voltage to said reference voltage.

6. A variable pulse width generator as claimed in claim 2, further comprising a transformer having primary and second windings, said selectable voltage being obtainable from a selectable alternating voltage applied across the primary winding of said transformer, the period of the alternating voltage being large compared to the period of the triangular waveform.

7. A variable pulse width generator as claimed in claim 6, wherein said transformer is a current transformer.

8. A variable pulse width generator as claimed in claim 6, wherein said transformer is a voltage transformer.

9. A variable pulse width generator for generating a waveform having a periodically recurring and variable mark-to-space ratio, wherein the ratio of the difference between the space and mark durations to the sum of the space and mark durations is proportional to a selectable voltage, comprising in combination:

an integrating amplifier, a first current component proportional to the selectable voltage being applied to the input of said integrating amplifier, switching means postcoupled to said integrating amplifier for receiving a reference voltage of selectable polarity, the polarity of the reference voltage being selectable in dependence of the integrating action of said integrating amplifier, and a feedback path permanently connecting the output of said switching means to the input of said integrating amplifier and including a first resistor connected to said switching means and a second resistor in series therewith connected to said integrating amplifier, said selectable voltage being applied across a selected one of said first and second resistors, the junction of said resistors being free from any direct connection to said integrating amplifier, a second current component proportional to a voltage developed across the output of said switching means being thereby applied to the input of said integrating amplifier, said switching means thereby operating in dependence of a current proportional to the voltage sum of said selectable and reference voltages appearing at the input of, and being integrated at the output of said integrating amplifier, and the ratio of the difference between the space and mark durations to the sum of the space and mark durations being thereby substantially independent of the other of said first and second resistors.

* * * * *